(12) United States Patent
Jiao et al.

(10) Patent No.: US 12,730,160 B2
(45) Date of Patent: Sep. 8, 2026

(54) SYSTEM AND METHOD OF MONITORING FUSES

(71) Applicant: Delta Electronics (Shanghai) Co., Ltd., Shanghai (CN)

(72) Inventors: Bing Jiao, Shanghai (CN); Jun Chen, Shanghai (CN); Zhizhen Lian, Shanghai (CN)

(73) Assignee: Delta Electronics (Shanghai) Co., Ltd., Shanghai (CN)

( * ) Notice: Subject to any disclaimer, the term of this patent is extended or adjusted under 35 U.S.C. 154(b) by 154 days.

(21) Appl. No.: 18/612,929

(22) Filed: Mar. 21, 2024

(65) Prior Publication Data

US 2024/0329158 A1 Oct. 3, 2024

(30) Foreign Application Priority Data

Mar. 29, 2023 (CN) ......................... 202310325877.7

(51) Int. Cl.
*G01R 31/74* (2020.01)

(52) U.S. Cl.
CPC .................................... *G01R 31/74* (2020.01)

(58) Field of Classification Search
None
See application file for complete search history.

(56) References Cited

U.S. PATENT DOCUMENTS 5,841,641 A * 11/1998 Faulk .................... H02M 3/335 363/80
10,018,665 B2 * 7/2018 Mitsuda ................ H02M 5/458
2013/0222951 A1 8/2013 Zhu et al.
2025/0246879 A1 * 7/2025 Bandaru ................. H02B 1/21

FOREIGN PATENT DOCUMENTS

CN 105305840 A 2/2016
CN 107247213 B 4/2020
TW 200719556 A 5/2007

* cited by examiner

*Primary Examiner* — Jermele M Hollington
(74) *Attorney, Agent, or Firm* — KIRTON McCONKIE; Evan R. Witt

(57) ABSTRACT

The present disclosure provides a system of monitoring fuses of a power conversion device. The power conversion device includes a first port, a first fuse and a converter. The first fuse is electrically coupled to the first port and a first safety circuit. The converter includes a first power terminal and a second fuse, and the second fuse is electrically coupled to the first port and the first power terminal. The system includes a first detection circuit and a second detection circuit. The first detection circuit is electrically coupled to the first fuse for detecting a first electrical signal. The second detection circuit is electrically coupled to the second fuse for detecting a second electrical signal.

17 Claims, 5 Drawing Sheets

SYSTEM AND METHOD OF MONITORING FUSES

CROSS-REFERENCE TO RELATED APPLICATION

This application claims priority to China Patent Application No. 202310325877.7, filed on Mar. 29, 2023, the entire contents of which are incorporated herein by reference for all purposes.

FIELD OF THE INVENTION

The present disclosure relates to a system and a method of monitoring fuses, and more particularly to a system and a method of monitoring the fuse connected to a safety circuit.

BACKGROUND OF THE INVENTION

The equipment such as photovoltaic inverter (PVI) and power conditioning system (PCS) are disposed outdoors. Therefore, it is necessary to equip lightning protection devices for the mentioned equipment. Surge protective device (SPD) is a common lightning protection device. A set of fuses is electrically connected in series to one terminal of the SPD for protecting the SPD and ensuring that the safety requirement is satisfied.

Since the SPD circuit is electrically connected in parallel to the main circuit of the equipment, the operation of the equipment will not be affected when the fuse connected to the SPD has blown, and thus the blowing of the fuse may not be known by the user immediately. When the fuse has blown, the fuse and SPD need to be replaced in time so as to prevent following lightning strikes from causing more damage to the equipment or circuit thereof. In order to confirm whether the fuse has blown in time and to send a reminder or an alert message to the user when the fuse has blown, a specific fuse is adopted.

In the conventional approach, a fuse with switch feedback contact is adopted, and the state of the contact changes when the fuse has blown. Therefore, whether the fuse has blown may be confirmed by detecting the state of the contact. However, the foregoing approach has following disadvantages. Firstly, the selection of fuses is limited since not all kinds of fuses have feedback contact, and generally the fuse with small capacity does not have feedback contact. Secondly, the circuit wiring is complex. For example, a set of SPD fuses at a three-phase AC port includes three fuses, and the feedback contacts of the three fuses need to be electrically connected in series. Accordingly, the circuit wiring would be more complicated if there are multiple sets of SPD fuses.

Therefore, there is a need of providing a system and a method of monitoring fuses to obviate the drawbacks encountered from the prior arts.

SUMMARY OF THE INVENTION

It is an object of the present disclosure to provide a system and a method of monitoring fuses. Whether the fuse has blown is determined in time by monitoring the electrical signal of the fuse connected to a safety circuit, thereby preventing the failure of the safety circuit and ensuring the electrical safety of an electronic equipment.

In accordance with an aspect of the present disclosure, there is provided a system of monitoring fuses of a power conversion device. The power conversion device includes a first terminal, a first fuse and a converter. A first terminal of the first fuse is electrically coupled to the first terminal, and a second terminal of the first fuse is electrically coupled to a first safety circuit. The converter includes a first power terminal and a second fuse, a first terminal of the second fuse is electrically coupled to the first terminal, and a second terminal of the second fuse is electrically coupled to the first power terminal. The system includes a first detection circuit and a second detection circuit. The first detection circuit is electrically coupled to the second terminal of the first fuse for detecting a first electrical signal. The second detection circuit is electrically coupled to the second terminal of the second fuse for detecting a second electrical signal.

In accordance with an aspect of the present disclosure, there is provided a method of monitoring fuses of a power conversion device. The power conversion device includes a first terminal, a first fuse and a converter. A first terminal of the first fuse is electrically coupled to the first terminal, and a second terminal of the first fuse is electrically coupled to a first safety circuit. The converter includes a first power terminal and a second fuse, a first terminal of the second fuse is electrically coupled to the first terminal, and a second terminal of the second fuse is electrically coupled to the first power terminal. The method includes steps of: (a) detecting a first electrical signal, wherein the first electrical signal is a signal of the second terminal of the first fuse; (b) detecting a second electrical signal, wherein the second electrical signal is a signal of the second terminal of the second fuse; and (c) determining states of the first fuse and the second fuse according to the first electrical signal and the second electrical signal.

The above contents of the present invention will become more readily apparent to those ordinarily skilled in the art after reviewing the following detailed description and accompanying drawings, in which:

DETAILED DESCRIPTION OF THE PREFERRED EMBODIMENT

The present disclosure will now be described more specifically with reference to the following embodiments. It is to be noted that the following descriptions of preferred embodiments of this disclosure are presented herein for purpose of illustration and description only. It is not intended to be exhaustive or to be limited to the precise form disclosed.

Figure 1:
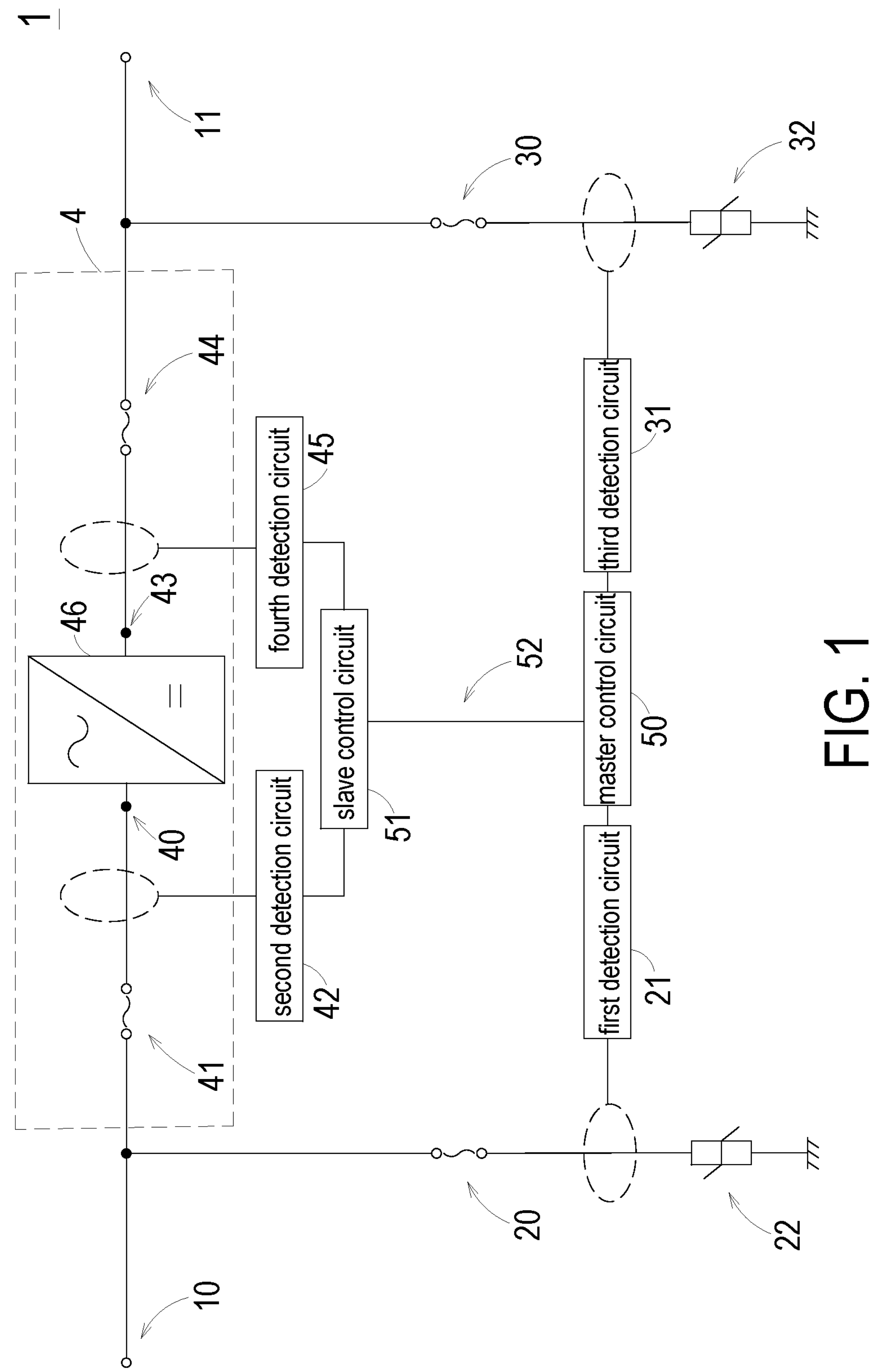
FIG. 1 is a schematic circuit diagram illustrating a power conversion device according to an embodiment of the present disclosure.

FIG. 1 is a schematic circuit diagram illustrating a power conversion device according to an embodiment of the present disclosure. As shown in FIG. 1, a system of monitoring fuses is applicable for the power conversion device 1. The power conversion device 1 includes a first port 10, a first fuse 20 and a converter 4. A first terminal of the first fuse 20 is electrically coupled to the first port 10, and a second terminal of the first fuse 20 is electrically coupled to a first safety circuit 22. The converter 4 includes a first power terminal 40 and a second fuse 41. A first terminal of the second fuse 41 is electrically coupled to the first port 10, and a second terminal of the second fuse 41 is electrically coupled to the first power terminal 40. The system includes a first detection circuit 21 and a second detection circuit 42. The first detection circuit 21 is electrically coupled to the second terminal of the first fuse 20 for detecting a first electrical signal, and the first electrical signal corresponds to the second terminal of the first fuse 20. The second detection circuit 42 is electrically coupled to the second terminal of the second fuse 41 for detecting a second electrical signal, and the second electrical signal corresponds to the second terminal of the second fuse 41. The first safety circuit 22 is for example but not limited to a surge protective device which can prevent the failure of the electrical equipment by releasing the local surge current (for example but not limited to the surge current generated under lightning strike).

In an embodiment, the system further includes a master control circuit 50 and a slave control circuit 51. The slave control circuit 51 is electrically connected to the second detection circuit 42 for receiving the second electrical signal and providing the second electrical signal to the master control circuit 50 through a communication bus 52. The master control circuit 50 is electrically connected to the first detection circuit 21, and the master control circuit 50 receives the first electrical signal and the second electrical signal and determines states of the first fuse 20 and the second fuse 41 according to the first electrical signal and the second electrical signal. The master control circuit 50 may be configured for controlling the power conversion device 1 and the converter 4, and the slave control circuit 51 may be configured for controlling the converter 4. The master control circuit 50 and the slave control circuit 51 are for example but not limited to include an analog circuit, a microprocessor, a digital signal processor (DSP), an application specific integrated circuit (ASIC), and/or a field programmable gate array (FPGA).

When the first electrical signal is normal and the second electrical signal is abnormal, the master control circuit 50 determines that the second fuse 41 is faulty. When the first electrical signal is abnormal and the second electrical signal is normal, the master control circuit 50 determines that the first fuse 20 is faulty. When the first electrical signal and the second electrical signal are both abnormal, the master control circuit 50 determines that a state of the first port 10 is abnormal. For example, the AC power provided by the AC power source or the power grid electrically connected to the first port 10 is abnormal. In an embodiment, the control circuit determines whether the voltage of the fuse is normal according to the detected electrical signals, thereby determining whether the fuse is faulty. In an embodiment, the faulty of the fuse represents that the fuse has blown.

The power conversion device 1 further includes a second port 11 and a third fuse 30. A first terminal of the third fuse 30 is electrically coupled to the second port 11, and a second terminal of the third fuse 30 is electrically coupled to a second safety circuit 32. The second safety circuit 32 is for example but not limited to a surge protective device. The converter 4 further includes a second power terminal 43 and a fourth fuse 44. A first terminal of the fourth fuse 44 is electrically coupled to the second port 11, and a second terminal of the fourth fuse 44 is electrically coupled to the second power terminal 43. The system further includes a third detection circuit 31 and a fourth detection circuit 45. The third detection circuit 31 is electrically coupled to the second terminal of the third fuse 30 for detecting a third electrical signal, and the third electrical signal corresponds to the second terminal of third fuse 30. The fourth detection circuit 45 is electrically coupled to the second terminal of the fourth fuse 44 for detecting a fourth electrical signal, and the fourth electrical signal corresponds to the second terminal of the fourth fuse 44. The slave control circuit 51 is electrically connected to the fourth detection circuit 45 for receiving the fourth electrical signal and providing the fourth electrical signal to the master control circuit 50 through the communication bus 52. The master control circuit 50 is electrically connected to the third detection circuit 31, and the master control circuit 50 receives the third electrical signal and the fourth electrical signal and determines states of the third fuse 30 and the fourth fuse 44 according to the third electrical signal and the fourth electrical signal.

When the third electrical signal is normal and the fourth electrical signal is abnormal, the master control circuit 50 determines that the fourth fuse 44 is faulty. When the third electrical signal is abnormal and the fourth electrical signal is normal, the master control circuit 50 determines that the third fuse 30 is faulty. When the third electrical signal and the fourth electrical signal are both abnormal, the master control circuit 50 determines that a state of the second port 11 is abnormal. For example, the DC power provided by the electrical equipment electrically coupled to the second port 11 is abnormal. In an embodiment, the faulty of the fuse represents that the fuse has blown. In an embodiment, the control circuit determines whether the voltage of the fuse is normal according to the detected electrical signals, thereby determining whether the fuse is faulty.

In the system of monitoring fuses of the present disclosure, whether the fuse has blown is determined in time by monitoring the electrical signal of the fuse connected to the safety circuit, thereby preventing the failure of the safety circuit and ensuring the electrical safety of the electronic equipment.

The converter 4 further includes a conversion circuit 46, and two terminals of the conversion circuit 46 are the first power terminal 40 and the second power terminal 43 respectively. In an embodiment, the first port 10 is an AC port of the power conversion device 1 electrically coupled to a power source or a load, and the second port 11 is a DC port of the power conversion device 1 electrically coupled to an energy storage device. Correspondingly, the first power terminal 40 is an AC power terminal of the conversion circuit 46, and the second power terminal 43 is a DC power terminal of the power conversion circuit 46. When the first port 10 provides an AC power, the first power terminal 40 of the converter 4 receives the AC power, the conversion circuit 46 converts the AC power into DC power, and the second port 11 provides a DC power output by the second power terminal 43 of the converter 4. Alternatively, when the second port 11 provides DC power, the second power terminal 43 of the converter 4 receives the DC power, the conversion circuit 46 converts the DC power into AC power, and the first port 10 provides AC power output by the first power terminal 40 of the converter 4.

Figure 2:
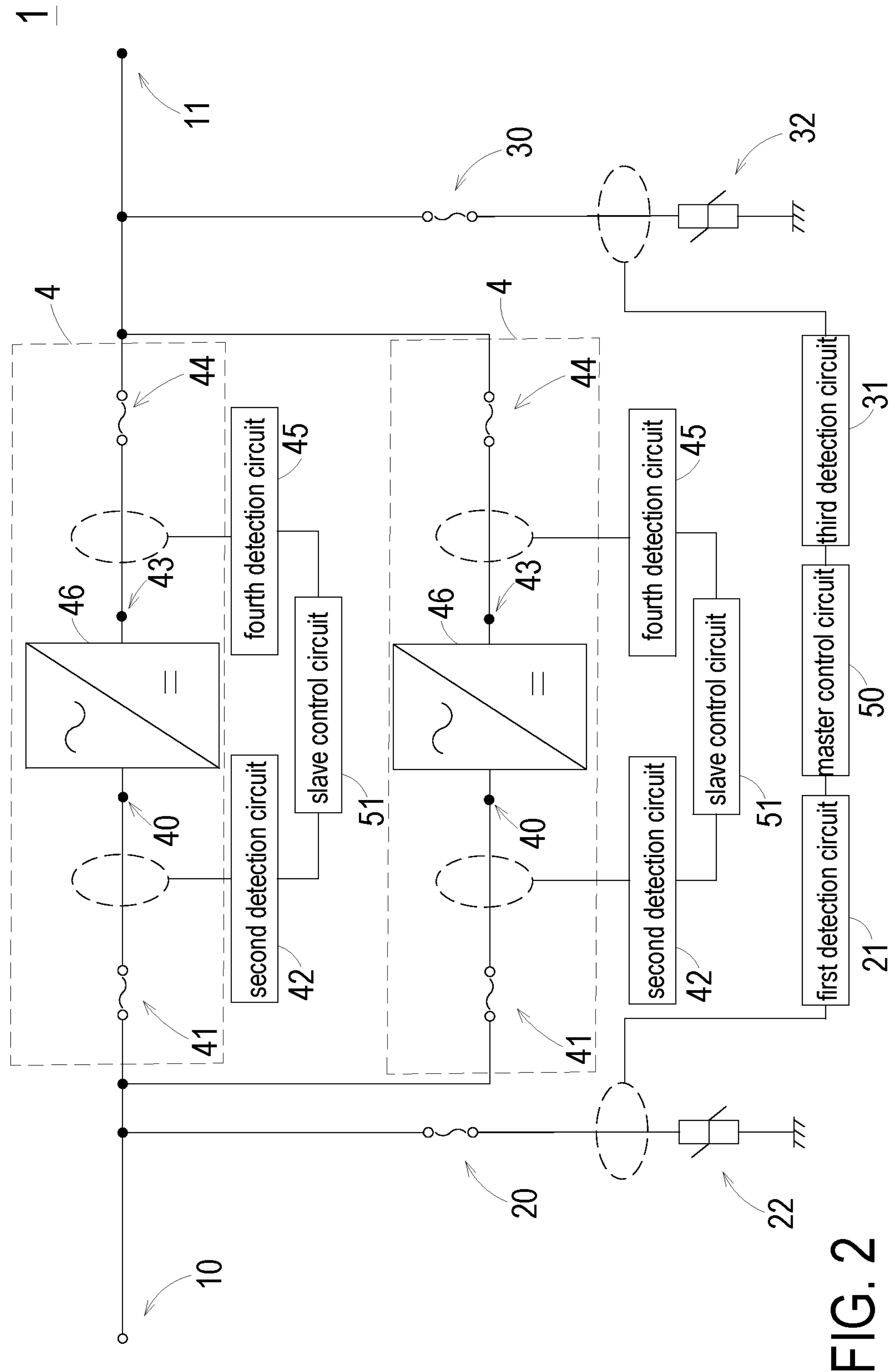
FIG. 2 is a schematic circuit diagram illustrating a power conversion device according to another embodiment of the present disclosure.

The amount of the converter 4 is not limited. In an embodiment, the power conversion device 1 may include a plurality of converters 4 electrically coupled in parallel, and the amount of the second detection circuits 42, the fourth detection circuits 45 and the slave control circuits 51 of the system corresponds to the amount of the converters 4. FIG. 2 is a schematic circuit diagram illustrating a power conversion device according to another embodiment of the present disclosure. The power conversion device 1 in FIG. 2 shows the implementation that the power conversion device 1 includes two converters 4. The structures and operations of the power conversion device 1 shown in FIG. 2 are similar with that shown in FIG. 1, and thus the detailed descriptions thereof are omitted herein.

Figure 3:
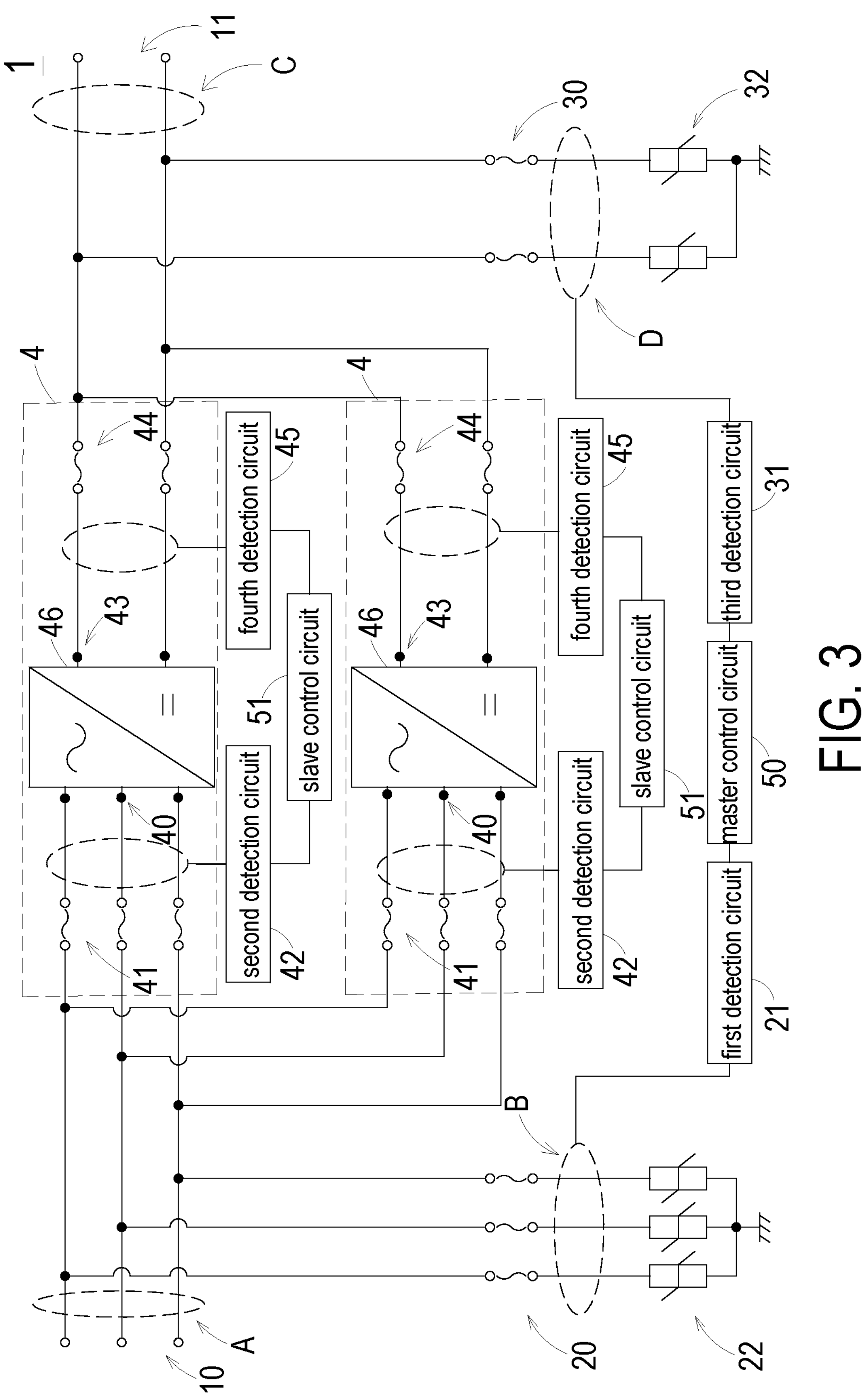
FIG. 3 is a schematic circuit diagram illustrating a power conversion device according to another embodiment of the present disclosure.

FIG. 3 is a schematic circuit diagram illustrating a power conversion device according to another embodiment of the present disclosure. As shown in FIG. 3, in this embodiment, the first port 10 of the power conversion device 1 is a three-phase AC port (three power lines are illustrated), and the second port 11 is a DC port (two power lines are illustrated). The power conversion device 1 includes two converters 4, the first power terminal 40 of each converter 4 is a three-phase AC power terminal, and the second power terminal 43 of each converter 4 is a DC power terminal. The AC sides of the two converters 4 are electrically coupled in parallel to the first port 10, and the DC sides of the two converters 4 are electrically connected in parallel to the second port 11. The power conversion device 1 includes three first fuses 20 and three first safety circuits 22, the first terminals of the three first fuses 20 are electrically connected to the three power lines of the first port 10 respectively, and the three first safety circuits 22 are electrically connected to the second terminals of the three first fuses 20 respectively. Each converter 4 includes three second fuses 41, the first terminals of the three second fuses 41 are electrically connected to the three power lines of the first port 10 respectively, and the second terminals of the three second fuses 41 are electrically connected to the three-phase AC power terminal respectively. The power conversion device 1 further includes two third fuses 30 and two second safety circuits 32, the first terminals of the two third fuses 30 are electrically connected to the positive and negative power-lines of the second port 11 respectively, and the two second safety circuits 32 are electrically connected to the second terminals of the two third fuses 30. Each converter 4 further includes two fourth fuses 44, the first terminals of the two fourth fuses 44 are electrically connected to the positive and negative power-lines of the second port 11 respectively, and the second terminals of the two fourth fuses 44 are electrically connected to the DC power terminal respectively.

In this embodiment, as shown in FIG. 3, the system includes a first detection circuit 21, two second detection circuits 42, a third detection circuit 31, two fourth detection circuits 45, a master control circuit 50 and two slave control circuit 51. The first detection circuit 21 is electrically coupled to the second terminals of the three first fuses 20. Each of the two second detection circuits 42 is electrically coupled to the second terminals of the corresponding three second fuses 41, which is the AC power terminal of the converter 4. The third detection circuit 31 is electrically coupled to the second terminals of the two third fuses 30. Each of the two fourth detection circuit 45 is electrically coupled to the second terminals of the corresponding two fourth fuse 44, which is the DC power terminal of the converter 4. Each of the two slave control circuits 51 is electrically connected to the corresponding second detection circuit 42 and the fourth detection circuit 45. The first detection circuit 21 is a first voltage detection circuit, the second detection circuit 42 is a second voltage detection circuit, the third detection circuit 31 is a third voltage detection circuit, and the fourth detection circuit 45 is a fourth voltage detection circuit. In addition to fuse status monitoring, the first, second, third, fourth detection circuits, the master control circuit 50 and the slave control circuit 51 are also configured for converter control, voltage control, power control, etc. Herein, the monitoring function and the control function are integrated, and the detection circuits and the control circuits are reused by the monitoring function and the control function.

Please refer to FIG. 3 again. In the conventional power conversion device, the detecting position of the first voltage detection circuit is at position "A". However, in the power conversion device 1 of the present disclosure, the detecting position of the first voltage detection circuit 21 is at position "B". In the conventional power conversion device, the detecting position of the third voltage detection circuit is at position "C". However, in the power conversion device 1 of the present disclosure, the detecting position of the third voltage detection circuit 31 is at position "D". By changing the detecting position of the first detection circuit 21 and the third detection circuit 31, the detection circuits may detect the electrical signals of the first port 10, the first fuse 20, the second port 11 and the third fuse 30 instead of only detecting the electrical signals of the first port 10 and the second port 11. Therefore, the utilization rate of the detection circuit is improved. Moreover, the first voltage detection circuit, second voltage detection circuit, third voltage detection circuit, fourth voltage detection circuit, master control circuit and slave control circuit of the power conversion device 1 are utilized to realize the fuse monitoring and device control simultaneously, such that an additional control circuit, wiring or detecting device are not required.

The master control circuit 50 receives the AC and/or DC electrical signal of the power conversion device 1 detected by the detection circuit. The slave control circuit 51 receives the AC and/or DC electrical signal of the converter 4 detected by the detection circuit and transmits the electrical signal to the master control circuit 50 through the communication bus 52. The master control circuit 50 determines whether the fuse is abnormal (for example, whether the fuse is blown) according to the AC and/or DC electrical signal. The determination is implemented by the master control circuit according to a default logic. When it is determined that the fuse is abnormal, the master control circuit 50 outputs a fault or warning signal.

In this embodiment, the determination logic is as follows. When the voltage detected by the first voltage detection circuit is normal, the voltage detected by the second voltage detection circuit is abnormal, and a difference between the effective values thereof is greater than 30V, the master control circuit 50 determines that the second fuse 41 is abnormal. When the voltage detected by the first voltage detection circuit is abnormal, the voltage detected by the second voltage detection circuit is normal, and a difference between the effective values thereof is greater than 30V, the master control circuit 50 determines that the first fuse 20 is abnormal. When the detected voltages of the first voltage detection circuit and the third voltage detection circuit are both abnormal, the master control circuit 50 determines that the first port 10 of the power conversion device 1 is abnormal.

When the voltage detected by the third voltage detection circuit is normal, the voltage detected by the fourth voltage detection circuit is abnormal, and a difference between the effective values thereof is greater than 30V, the master control circuit 50 determines that the fourth fuse 44 is abnormal. When the voltage detected by the third voltage detection circuit is abnormal, the voltage detected by the fourth voltage detection circuit is normal, and a difference between the effective values thereof is greater than 30V, the master control circuit 50 determines that the third fuse 30 is abnormal. When the detected voltages of the third voltage detection circuit and the fourth voltage detection circuit are both abnormal, the master control circuit 50 determines that the second port 11 of the power conversion device 1 is abnormal.

Figure 4:
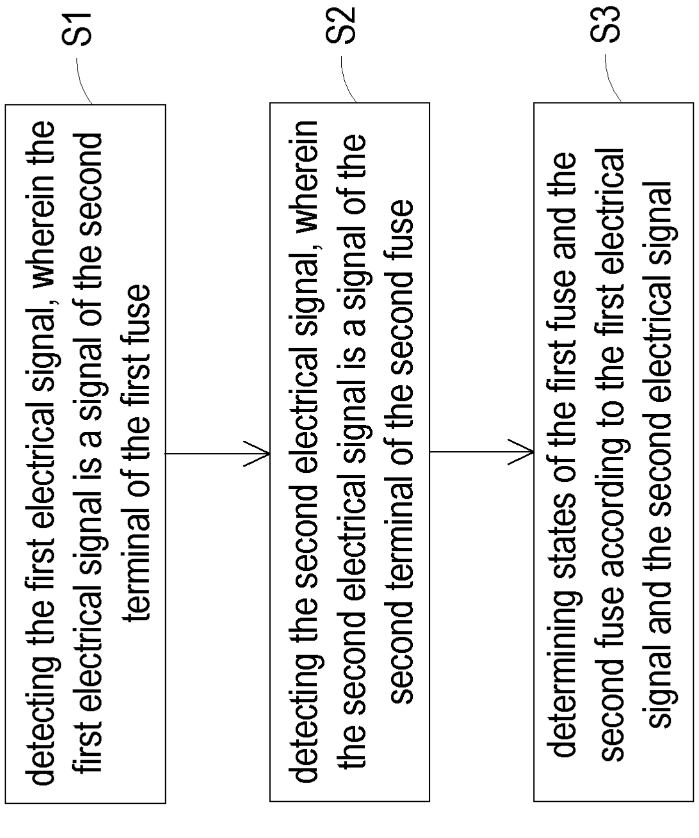
FIG. 4 is a schematic flow chart illustrating a method of monitoring fuses according to an embodiment of the present disclosure.

FIG. 4 is a schematic flow chart illustrating a method of monitoring the fuses according to an embodiment of the present disclosure. The method of the present disclosure is applicable for the power conversion device 1 and the system stated above. Please refer to FIG. 4, the method of monitoring the fuses includes steps S1, S2 and S3. In the step S1, detect the first electrical signal, the first electrical signal is a signal of the second terminal of the first fuse 20, and the first electrical signal is detected by the first detection circuit. In the step S2, detect the second electrical signal, the second electrical signal is a signal of the second terminal of the second fuse 41, and the second electrical signal is detected by the second detection circuit. In the step S3, determine states of the first fuse 20 and the second fuse 41 according to the first electrical signal and the second electrical signal. The states of the first fuse 20 and the second fuse 41 are determined according to the first electrical signal and the second electrical signal by the master control circuit.

In an embodiment, the step S1 of the method further includes providing the first electrical signal to the master control circuit 50. The step S2 further includes providing the second electrical signal to the slave control circuit 51 so that the slave control circuit 51 provides the second electrical signal to the master control circuit 50 through the communication bus 52. The step S3 further includes steps of: determining that the second fuse 41 is faulty when the first electrical signal is normal and the second electrical signal is abnormal; determining that the first fuse 20 is faulty when the first electrical signal is abnormal and the second electrical signal is normal; and determining that a state of the first port 10 is abnormal when the first electrical signal and the second electrical signal are both abnormal.

Figure 5:
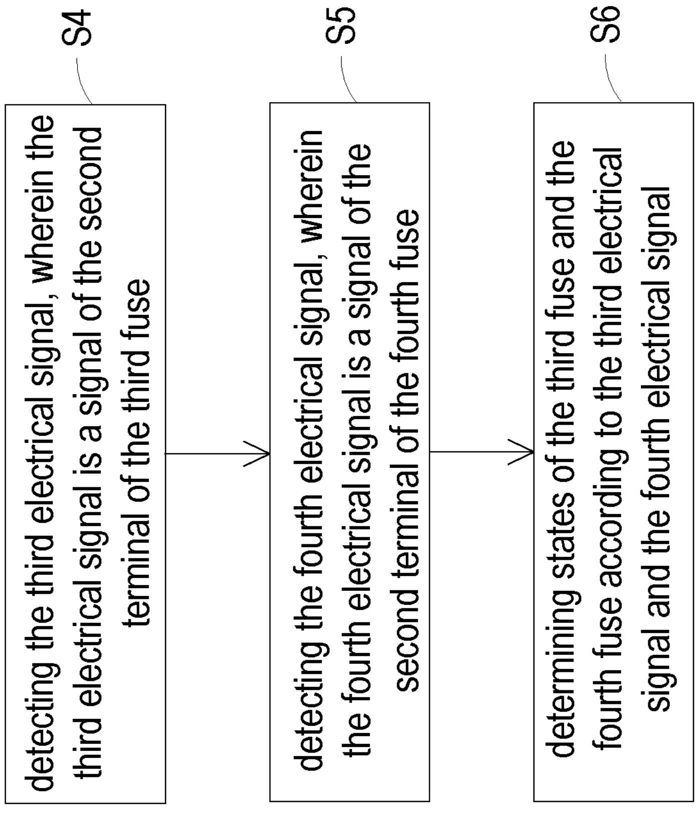
FIG. 5 is a schematic flow chart illustrating a method of monitoring fuses according to another embodiment of the present disclosure.

In an embodiment, the method of monitoring the fuses further includes steps S4, S5 and S6. As shown in FIG. 5, in the step S4, detect the third electrical signal, the third electrical signal is a signal of the second terminal of the third fuse 30, and the third electrical signal is detected by the third detection circuit. In the step S5, detect the fourth electrical signal, the fourth electrical signal is a signal of the second terminal of the fourth fuse 44, and the fourth electrical signal is detected by the fourth detection circuit. In the step S6, determine states of the third fuse 30 and the fourth fuse 44 according to the third electrical signal and the fourth electrical signal. The states of the third fuse 30 and the fourth fuse 44 are determined according to the third electrical signal and the fourth electrical signal by the master control circuit.

In an embodiment, the step S4 of the method of monitoring the fuses further includes providing the third electrical signal to the master control circuit 50. The step S5 further includes providing the fourth electrical signal to the slave control circuit 51 so that the slave control circuit 51 provides the fourth electrical signal to the master control circuit 50 through the communication bus 52. The step S6 further includes steps of: determining that the fourth fuse 44 is faulty when the third electrical signal is normal and the fourth electrical signal is abnormal; determining that the third fuse 30 is faulty when the third electrical signal is abnormal and the fourth electrical signal is normal; and determining that a state of the second port 11 is abnormal when the third electrical signal and the fourth electrical signal are both abnormal.

From the above descriptions, a system and a method of monitoring fuses is provided. In the system and method of monitoring fuses of the present disclosure, whether the fuse has blown is determined in time by monitoring the electrical signal of the fuse connected to the safety circuit, thereby preventing the failure of the safety circuit and ensuring the electrical safety of the electronic equipment.

While the disclosure has been described in terms of what is presently considered to be the most practical and preferred embodiments, it is to be understood that the disclosure needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A system of monitoring fuses of a power conversion device, wherein the power conversion device comprises a first port, a first fuse and a converter, a first terminal of the first fuse is electrically coupled to the first port, a second terminal of the first fuse is directly electrically coupled to a first terminal of a first safety circuit, a second terminal of the first safety circuit is coupled to a reference potential, the converter comprises a first power terminal and a second fuse, a first terminal of the second fuse is electrically coupled to the first port, and a second terminal of the second fuse is electrically coupled to the first power terminal; and wherein the system comprises:

a first detection circuit, electrically coupled to the second terminal of the first fuse for detecting a first electrical signal; and a second detection circuit, electrically coupled to the second terminal of the second fuse for detecting a second electrical signal.

2. The system according to claim 1, further comprising a master control circuit and a slave control circuit, wherein the slave control circuit receives the second electrical signal and provides the second electrical signal to the master control circuit, and the master control circuit receives the first electrical signal and the second electrical signal and determines states of the first fuse and the second fuse according to the first electrical signal and the second electrical signal.

3. The system according to claim 2, wherein when the first electrical signal is normal and the second electrical signal is abnormal, the master control circuit determines that the second fuse is faulty;

wherein when the first electrical signal is abnormal and the second electrical signal is normal, the master control circuit determines that the first fuse is faulty; and wherein when the first electrical signal and the second electrical signal are both abnormal, the master control circuit determines that a state of the first port is abnormal.

4. The system according to claim 2, wherein the power conversion device further comprises a second port and a third fuse, a first terminal of the third fuse is electrically coupled to the second port, a second terminal of the third fuse is electrically coupled to a second safety circuit, the converter further comprises a second power terminal and a fourth fuse, a first terminal of the fourth fuse is electrically coupled to the second port, and a second terminal of the fourth fuse is electrically coupled to the second power terminal; and wherein the system further comprises:

a third detection circuit, electrically coupled to the second terminal of the third fuse for detecting a third electrical signal; and a fourth detection circuit, electrically coupled to the second terminal of the fourth fuse for detecting a fourth electrical signal.

5. The system according to claim 4, wherein the slave control circuit receives the fourth electrical signal and provides the fourth electrical signal to the master control circuit, and the master control circuit receives the third electrical signal and the fourth electrical signal and determines states of the third fuse and the fourth fuse according to the third electrical signal and the fourth electrical signal.

6. The system according to claim 5, wherein when the third electrical signal is normal and the fourth electrical signal is abnormal, the master control circuit determines that the fourth fuse is faulty;

wherein when the third electrical signal is abnormal and the fourth electrical signal is normal, the master control circuit determines that the third fuse is faulty; and wherein when the third electrical signal and the fourth electrical signal are both abnormal, the master control circuit determines that a state of the second port is abnormal.

7. The system according to claim 4, wherein the first port is an AC port of the power conversion device electrically coupled to a power source or a load;

the second port is a DC port of the power conversion device electrically coupled to an energy storage device; and the first power terminal is an AC power terminal, and the second power terminal is a DC power terminal of the converter.

8. The system according to claim 4, wherein the power conversion device comprises a plurality of the converters, and a plurality of the converters are coupled in parallel.

9. The system according to claim 8, wherein the system comprises a plurality of the fourth detection circuits, and an amount of the fourth detection circuits is equal to an amount of the converters.

10. The system according to claim 2, wherein the power conversion device comprises a plurality of the converters, and a plurality of the converters are coupled in parallel.

11. The system according to claim 10, wherein the system comprises a plurality of the slave control circuits, and an amount of the slave control circuits is equal to an amount of the converters.

12. The system according to claim 1, wherein the power conversion device comprises a plurality of the converters, and a plurality of the converters are electrically coupled in parallel.

13. The system according to claim 12, wherein the system comprises a plurality of the second detection circuits, and an amount of the second detection circuits is equal to an amount of the converters.

14. A method of monitoring fuses of a power conversion device, wherein the power conversion device comprises a first port, a first fuse and a converter, a first terminal of the first fuse is electrically coupled to the first port, a second terminal of the first fuse is directly electrically coupled to a first terminal of a first safety circuit, a second terminal of the first safety circuit is coupled to a reference potential, the converter comprises a first power terminal and a second fuse, a first terminal of the second fuse is electrically coupled to the first port, and a second terminal of the second fuse is electrically coupled to the first power terminal; wherein the method is performed by a system comprising a first detection circuit electrically coupled to the second terminal of the first fuse, a second detection circuit electrically coupled to the second terminal of the second fuse, and a master control circuit electrically connected to the first detection circuit and the second detection circuit; and wherein the method comprises:

(a) the first detection circuit detecting a first electrical signal, wherein the first electrical signal is a signal of the second terminal of the first fuse;

(b) the second detection circuit detecting a second electrical signal, wherein the second electrical signal is a signal of the second terminal of the second fuse; and (c) the master control circuit determining states of the first fuse and the second fuse according to the first electrical signal and the second electrical signal.

15. The method according to claim 14, wherein the step (c) further comprises:

the master control circuit determining that the second fuse is faulty when the first electrical signal is normal and the second electrical signal is abnormal;

the master control circuit determining that the first fuse is faulty when the first electrical signal is abnormal and the second electrical signal is normal; and the master control circuit determining that a state of the first port is abnormal when the first electrical signal and the second electrical signal are abnormal.

16. The method according to claim 14, wherein the power conversion device further comprises a second port and a third fuse, a first terminal of the third fuse is electrically coupled to the second port, a second terminal of the third fuse is electrically coupled to a second safety circuit, the converter further comprises a second power terminal and a fourth fuse, a first terminal of the fourth fuse is electrically coupled to the second port, a second terminal of the fourth fuse is electrically coupled to the second power terminal, wherein the system further comprises a third detection circuit electrically coupled to the second terminal of the third fuse and a fourth detection circuit electrically coupled to the second terminal of the fourth fuse, and the master control circuit is electrically connected to the third detection circuit and the fourth detection circuit; and wherein the method comprises:

(a1) the third detection circuit detecting a third electrical signal, wherein the third electrical signal is a signal of the second terminal of the third fuse;

(b1) the fourth detection circuit detecting a fourth electrical signal, wherein the fourth electrical signal is a signal of the second terminal of the fourth fuse; and (c1) the master control circuit determining states of the third fuse and the fourth fuse according to the third electrical signal and the fourth electrical signal.

17. The method according to claim 16, wherein the step (c1) further comprises:

the master control circuit determining that the fourth fuse is faulty when the third electrical signal is normal and the fourth electrical signal is abnormal;

the master control circuit determining that the third fuse is faulty when the third electrical signal is abnormal and the fourth electrical signal is normal; and the master control circuit determining that a state of the second port is abnormal when the third electrical signal and the fourth electrical signal are abnormal.

* * * * *